United States Patent
Yang et al.

(10) Patent No.: US 8,575,585 B2
(45) Date of Patent: Nov. 5, 2013

(54) MEMRISTIVE DEVICE

(75) Inventors: Jianhua Yang, Palo Alto, CA (US); Qiangfei Xia, Palo Alto, CA (US); Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/382,281

(22) PCT Filed: Jul. 13, 2009

(86) PCT No.: PCT/US2009/050433
§ 371 (c)(1),
(2), (4) Date: Jan. 4, 2012

(87) PCT Pub. No.: WO2011/008195
PCT Pub. Date: Jan. 20, 2011

(65) Prior Publication Data
US 2012/0104342 A1    May 3, 2012

(51) Int. Cl.
*H01L 29/02* (2006.01)
*H01L 47/00* (2006.01)
*H01L 23/48* (2006.01)
*H01L 23/52* (2006.01)
*H01L 29/40* (2006.01)
*H01L 21/20* (2006.01)

(52) U.S. Cl.
USPC  257/2; 257/776; 257/E45.002; 257/E45.003; 438/382

(58) Field of Classification Search
USPC ........ 257/2, E45.002, E45.003, 776; 438/382
See application file for complete search history.

(56) References Cited

U.S. PATENT DOCUMENTS

| | | | |
|---|---|---|---|
| 6,458,621 B1 | 10/2002 | Beck | |
| 6,855,647 B2 | 2/2005 | Beck et al. | |
| 7,074,515 B2* | 7/2006 | Yamauchi et al. | 429/465 |
| 7,417,271 B2 | 8/2008 | Genrikh et al. | |
| 7,763,880 B2* | 7/2010 | Williams | 257/8 |
| 7,846,807 B2* | 12/2010 | Tang et al. | 438/385 |
| 7,868,537 B2* | 1/2011 | Meijer et al. | 313/504 |
| 7,985,962 B2* | 7/2011 | Bratkovski et al. | 257/4 |
| 8,018,430 B2* | 9/2011 | Choi et al. | 345/107 |
| 8,021,897 B2* | 9/2011 | Sills et al. | 438/3 |
| 8,059,453 B2* | 11/2011 | Wang et al. | 365/158 |
| 8,093,575 B2* | 1/2012 | Xia et al. | 257/4 |
| 2003/0143790 A1 | 7/2003 | Wu | |
| 2003/0173612 A1 | 9/2003 | Krieger et al. | |
| 2005/0233476 A1* | 10/2005 | Tatsunari | 438/3 |
| 2007/0052351 A1* | 3/2007 | Kim et al. | 313/506 |
| 2008/0079029 A1 | 4/2008 | Williams | |
| 2008/0090337 A1 | 4/2008 | Williams | |
| 2008/0106927 A1 | 5/2008 | Celinska et al. | |
| 2010/0277232 A1* | 11/2010 | Snider | 327/565 |

(Continued)

OTHER PUBLICATIONS

Choi, B.J., et al., "Resistive switching mechanism of TiO2 thin films grown by atomic-layer deposition", Journal of Applied Physics 98, (2005). pp. 033715-1-033715-10.

(Continued)

*Primary Examiner* — Ida M Soward

(57) ABSTRACT

A memristive device includes a first electrode, a second electrode crossing the first electrode at a non-zero angle, and an active region disposed between the first and second electrodes. The active region has a controlled defect profile throughout its thickness.

15 Claims, 5 Drawing Sheets

(56) References Cited

U.S. PATENT DOCUMENTS

| | | | | |
|---|---|---|---|---|
| 2011/0182108 | A1* | 7/2011 | Williams et al. | 365/148 |
| 2011/0188294 | A1* | 8/2011 | Strachan et al. | 365/148 |
| 2011/0221027 | A1* | 9/2011 | Quitoriano et al. | 257/485 |
| 2011/0227031 | A1* | 9/2011 | Li et al. | 257/5 |
| 2011/0240941 | A1* | 10/2011 | Pickett et al. | 257/1 |
| 2011/0248381 | A1* | 10/2011 | Tong et al. | 257/537 |
| 2011/0266605 | A1* | 11/2011 | Strukov et al. | 257/314 |
| 2012/0001143 | A1* | 1/2012 | Strukov et al. | 257/2 |
| 2012/0032134 | A1* | 2/2012 | Yang et al. | 257/4 |
| 2012/0175583 | A1* | 7/2012 | Nugent | 257/5 |

OTHER PUBLICATIONS

Rothschild, A. et al., "Etectronic and transport properties of reduced and oxidized nanocrystalline TiO2 Films", Applied Physics Letters, vol. 82, No. 4, Jan. 27, 2003, pp. 574-576.

Blanc, Joseph, et al., "Electrocoloration in SrTiO3; Vacancy Drift and Oxidation-Reduction of Transition Metals", Physical Review B, vol. 4, No. 10, Nov. 15, 1971, pp. 3548-3557.

Knauth, P., "Defect and transport properties of nonocrystalline ceramics and thin films", J. Solid State Electrochem (2002), vol. 6, pp. 165-171.

Weibel, A. et al., "Electrical properties and defect chemistry of anatase (Ti02)", Solid State Ionics 177 (2006), pp. 229-236.

Dearnaley, G., et al., "Electrical phenomena in amorphous oxide films" Rep. Prog. Phys., 1970, 33, pp. 1129-1191.

Jeong, Doo Seok, et al., "Impedance spectroscopy of TiO2 thin films showing resistive switching", Applied Physics Letters 89, 2006, pp. 082909-1-082909-3.

Meijer, G. I., "Who Wins the Nonvolatile Memory Race?", Science, vol. 319, Mar. 21, 2008, pp. 1625-1626.

Sawa, Akihito, "Resistive switching in transition metal oxides", materialstoday, vol. 11, No. 6, Jun. 2008, pp. 28-36.

Strukov, Dmitri B., et al., "The missing memristor found", Nature Letters, vol. 453, May 1, 2008, pp. 80-83.

Strukov, Dmitri B., et al., "Exponential ionic drift: fast switching and low volatility of thin-film memristors", Applied Physics A, Nov. 28, 2008, 5 pgs.

Waser, Rainer, et al., "Nanoionios-based resistive switching memories", nature materials, vol. 6, Nov. 2007, pp. 833-840, www.nature.com/naturematerials.

Yang, J. J., et al., "Memristive switching mechanism for metal/oxide/metal nanodevices", nature nanotechnology, vol. 3, Jul. 2008, pp. 429-433.

Kukli, Kaupo, et al., "Real-Time Monitoring in Atomic Layer Deposition of TiO2 from TiI4 and H2O-H2O2", Langmuir, vol. 16, No. 21, 2000, pp. 8122-8128.

Choi, B. J., et al., "Resistive switching mechanism of TiO2 thin films grown by atomic-layer deposition", Journal of Applied Physics 98, (2005), pp. 033715-1-033715-10.

"Atomic Layer Deposition", Cambridge Nanotech Inc., Copyright 2005, 41 pgs.

* cited by examiner

MEMRISTIVE DEVICE

BACKGROUND

The present disclosure relates generally to memristive devices.

Nanometer-scale crossed-wire switching devices have previously been reported that could be switched reversibly and had an ON-to-OFF conductance ratio up to $10^4$. Such devices have been used to construct crossbar circuits and provide a promising route for the creation of ultra-high density non-volatile memory and systems with dynamic/synaptic logic. A latch (which is an important component for logic circuits and for communication between logic and memory) has been fabricated from a series connection of crossed-wire switches. New logic families, constructed entirely from crossbar arrays of switches or as hybrid structures composed of switches and transistors, have also been described. These new logic families have the potential to dramatically increase the computing efficiency of CMOS circuits.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

DETAILED DESCRIPTION

Memristor device operation is believed to rely on the motion of mobile charged species through an active region between two electrodes. In a vertically oriented structure, the device center and active region is distinguishable from (and is located between) its sidewalls, which are defined by the edges of the top and bottom electrodes. The nature of memristor active region forming has been non-deterministic, and the present inventors have found that by controlling various parameters during active region formation, precise defect concentrations throughout the thickness of the active region may be achieved. Such controlled fabrication enables one to control both the resistivity and the switching polarity of the resulting device. As such, precise, reliable device fabrication and operation may be achieved. In addition to the other advantageous features listed herein, the formation of the controlled profile is reproducible at each electrode junction in a crossbar array.

Figure 1:
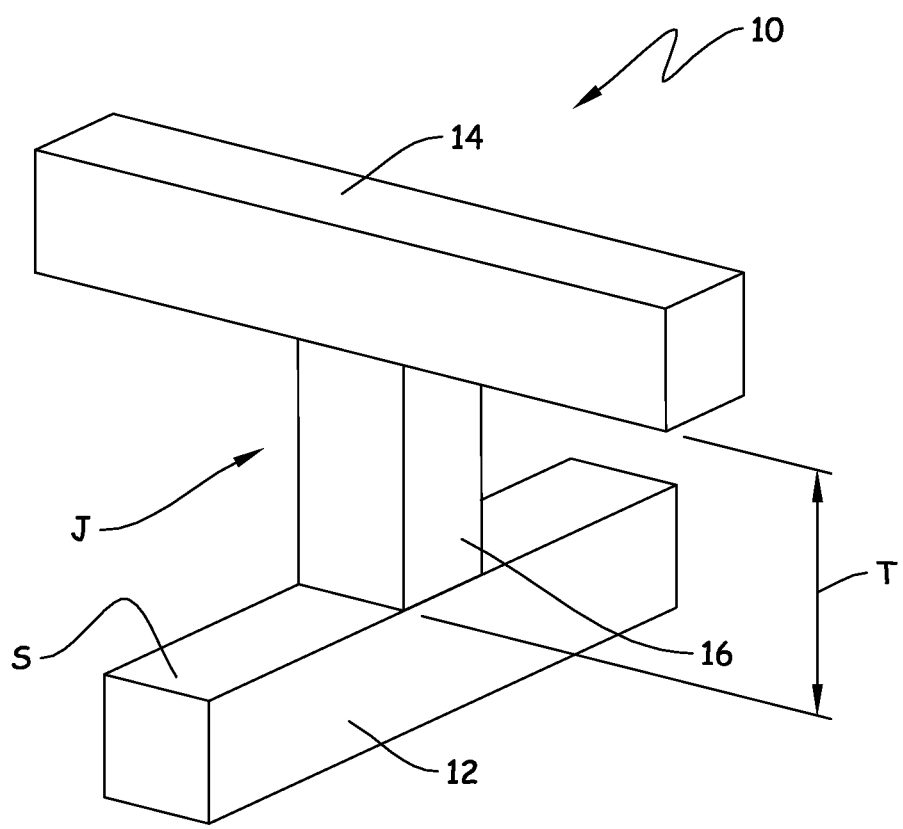
FIG. 1 is a semi-schematic perspective view of an embodiment of a memristive device.

Referring now to FIG. 1, an embodiment of the memristive device 10 (also referred to herein as a memristor) including two electrodes 12, 14 having a single cross-point/junction J therebetween is depicted. The device 10 shown in the Figures is generally constructed vertically, and thus the electrodes 12, 14 are bottom and top electrodes, respectively.

The electrodes 12, 14 may be formed of any suitable conductive material (e.g., gold, platinum, tungsten, copper, etc.), and may have any suitable thickness (e.g., ranging from about 5 nm to about 30 nm). It is to be understood that both the material and the thickness of the electrodes 12, 14 may be varied as is desirable to achieve one or more particular device properties. Although individual electrodes 12, 14 in the figures are shown with square or rectangular cross-sections, wires may also have circular, elliptical, or more complex cross-sections. The electrodes 12, 14 may also have many different widths or diameters and aspect ratios or eccentricities.

The first electrode 12 may be fabricated using conventional techniques, such as photolithography or electron beam lithography, or by more advanced techniques, such as imprint lithography.

In the vertically constructed device 10, as shown in FIG. 1, one or more layers are established to form the active region 16 at the cross-point/junction J between the electrodes 12, 14. Each layer of the active region 16 is formed with a precise defect concentration so that the entire active region exhibits a desirable defect concentration profile when the device 10 is in an OFF state. The profile may be a continuous gradient in which the defect concentration increases or decreases along the thickness T of the entire active region 16, or it may include discrete areas having different defect concentrations (e.g., one area has a predetermined amount of oxygen vacancy defects and another area is substantially void of oxygen vacancy defects). It is to be understood that an area substantially void of defects has little or no defects therein, and as such, has a resistivity of more than $10^4$ ohm-CM.

The layers of the active region 16 are formed via atomic layer deposition (ALD). As discussed in more detail hereinbelow, controlling the parameters throughout the ALD process enables each layer of the active region 16 to be formed with precision. Generally, ALD involves sequential pulsing of different chemical precursor vapors, both of which form about one atomic layer per pulse. It is to be understood that the pulses may be continued until a desirable thickness of the active region 16 is achieved.

In the embodiments disclosed herein, all or a portion of the surface S of the electrode 12 is exposed to the pulse of a metal precursor, and then is exposed to the pulse of an oxygen precursor, a nitride precursor, or a sulfide precursor. The metal precursor is selected so that upon reacting with the oxygen, nitride, or sulfide precursor, a metal oxide layer, a metal nitride layer, or a metal sulfide layer having a predetermined defect concentration is formed. In one embodiment, the metal precursor is a titanium precursor and has the chemical formula of $C_{16}H_{40}N_4Ti$ (tetrakis(diethylamido)titanium (IV)). It is believed that other titanium precursors, such as tetrakis(dimethylamido)titanium(IV) and titanium(IV) isopropoxide, may also be used. It is to be understood that precursors of nickel, gallium, zirconium, hafnium, or strontium and titanium may also be used.

After the pulse of metal precursor, at least the metal, having some dangling groups attached thereto, is deposited on the surface S of the electrode 12. Any reaction product resulting from the metal precursor pulse may be removed prior to the subsequent pulse.

It is to be understood that the oxygen precursor, nitride precursor, or sulfide precursor pulse that is pulsed into the reaction chamber after the metal precursor is selected based upon whether it is desirable to form a metal oxide, a metal nitride, or a metal sulfide. When a metal oxide layer is to be formed, non-limiting examples of suitable oxygen precursors include water, oxygen plasma, or ozone. When a metal nitride layer is to be formed, non-limiting examples of suitable nitrogen precursors include $NH_3$ or $N_2/H_2$. When a metal sulfide layer is formed, one non-limiting example of suitable sulfur precursors includes $H_2S/N_2$. The oxygen precursor, nitride precursor, or sulfide precursor reacts with the dangling groups to form the metal oxide, metal nitride, or the metal sulfide, respectively. Again, any reaction product resulting from the oxygen/nitrogen/sulfur precursor pulse may be removed prior to any further processing.

It is to be understood that one metal precursor pulse and one oxygen/nitrogen/sulfur precursor pulse makes up a single cycle and forms a single layer of the active region 16. The pulse combinations may be repeated as many times is desirable to achieve the desirable thickness T of the active region 16. In one embodiment, the thickness T ranges from about 2 nm to about 200 nm.

Each of the resulting layers has a controlled concentration of defects therein. Since the defect concentration of each respective layer is controllable, the defect profile of the entire active region 16 is also controllable. Such defects are generated during the formation of the layers. For example, oxygen vacancy defects are formed in the metal oxide layer, nitrogen vacancy defects are formed in the metal nitride layer, and sulfur vacancy defects are formed in the metal sulfide layer. The concentration of the defects may be controlled by controlling the temperature throughout the ALD process. As such, the composition of the metal oxide, metal nitride, or metal sulfide layer may advantageously be controlled. As illustrated in the Example provided herein, the temperature affects the defect concentration, and thus affects the resistivity of the resulting oxide layer. Generally, the higher the temperature is during layer growth, the more conductive the resulting film will be and the more defects that are formed in the layer. More particularly, the temperature selected during growth will depend, at least in part, upon the material system (e.g., the precursors) selected.

By varying the temperature continuously from one cycle (layer) to the next, one can achieve the previously mentioned continuous defect gradient throughout the active region 16. By maintaining the temperature for a predetermined number of cycles, one can achieve a portion of the active region 16 that has a first concentration, and by changing the temperature for a subsequent predetermined number of cycles, one can achieve a second portion of the active region 16 that has a second concentration that is different than the first concentration. It is believed that any desirable defect profile may be achieved, as long as the temperature is properly controlled throughout the ALD process.

It is to be understood that during the formation of each layer of the active region 16, the pulse duration of the various gases may also be altered. It is believed that varying the pulse duration is not as effective as changing the temperature when it is desirable to control the defect concentration, and in some instances, the effect that varying the pulse duration has on defect concentration is almost negligible compared to the effect that varying the temperature has on defect concentration.

As shown in FIG. 1, the layers deposited to form the active region 16 may be established on a portion of the surface S. This is accomplished using selective ALD. Generally, when selective ALD is used to establish the materials on the portion of the first electrode surface S, the materials are positioned such that they are or will be located in the junction J between the electrodes 12, 14. It is to be understood however, that the materials may also be deposited along the entire surface S (see, e.g., FIG. 5). In such instances, the portion of the materials at the junction J form the active region 16 and the materials positioned adjacent to the junction J remain inactive, as no voltage is applied therebetween.

Once the active region 16 is formed, the top/second electrode 14 is positioned thereon at some desirable angle that is non-parallel to the orientation of the bottom/first electrode 12. The second electrode 14 may be the same material as, or a different material than the first electrode 12, and may be established via the same or a different technique than that used to establish the first electrode 12. In one example, the second electrode 14 is evaporated on the material 18 with an electron beam evaporator.

Figure 2A:
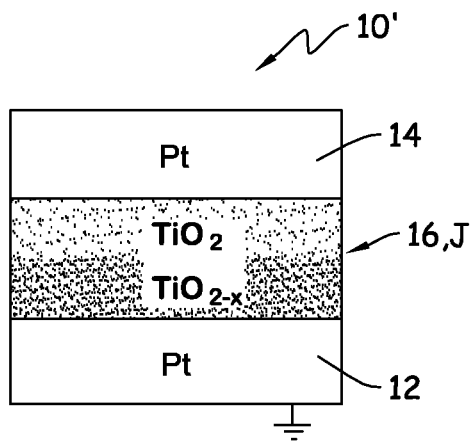
FIG. 2A is a cross-sectional view of an embodiment of the memristive device.
Figure 2B:
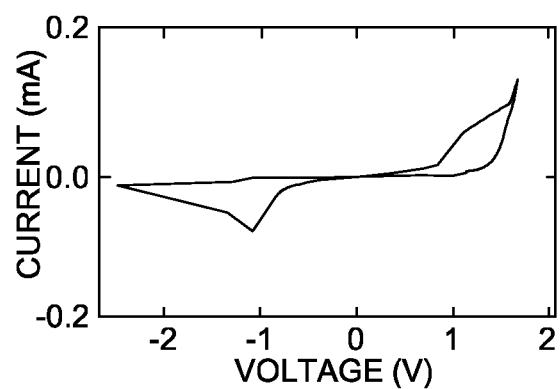
FIG. 2B is a graph illustrating a current vs. voltage (IV) curve for the embodiment of the memristive device of FIG. 2A.
Figure 3A:
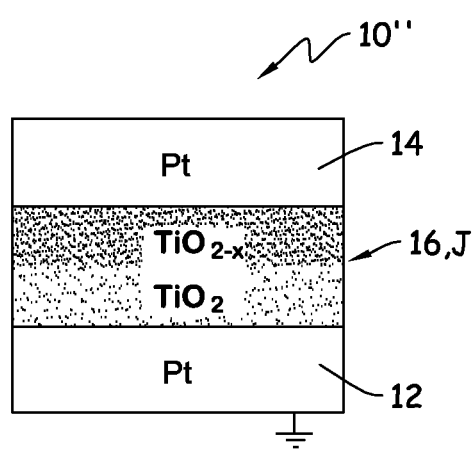
FIG. 3A is a cross-sectional view of another embodiment of the memristive device.

Referring now to FIGS. 2A and 3A, two embodiments of the controlled active region 16 defect profile are depicted. These Figures, in conjunction with FIGS. 2B and 3B, also illustrate how the controlled profile enables the selection of the switching polarity.

In FIG. 2A, the temperature during the initial stages of the ALD process is higher, thereby resulting in a portion of the active region 16 (labeled $TiO_{2-x}$, where $0<x<2$) having defects (e.g., oxygen vacancies) therein. In this embodiment, the temperature is decreased as the ALD process continues, thereby resulting in another portion of the active region 16 (labeled $TiO_2$) that has no defects therein. In FIG. 3A, however, the temperature during the initial stages of the ALD process is lower, thereby resulting in a portion of the active region 16 (labeled $TiO_2$) that has no defects therein. In this embodiment, the temperature is increased as the ALD process continues, thereby resulting in another portion of the active region 16 (labeled $TiO_{2-x}$) having defects therein. Together, FIGS. 2A and 3A illustrate that different defect concentration profiles may be achieved in the active regions 16 disclosed herein.

In either embodiment, the lack or substantial void of oxygen vacancy defects at an interface near one of the electrodes (e.g., the top electrode 14 in FIG. 2A and the bottom electrode 12 in FIG. 3A) generates a tunneling barrier or gap, which blocks current flow between the electrodes 12, 14. As such, the devices 10', 10" shown in FIGS. 2A and 3A are in an OFF state. In the OFF state, one interface in the device 10, 10', 10" contains defects and is an ohmic-like contact, and the other interface contains no defects and is a non-ohmic contact. The tunneling barrier limits the electronic transport across the junction J until a voltage that exceeds the threshold field for the drift of the defects is applied to the device 10, 10', 10". In the OFF state, the active region 16 is essentially intrinsic, i.e., there is a controlled small number of defects in the lattice. In such instances, the interface contact governs the electrical transport of the junction J.

Upon application of a suitable voltage, the defects drift towards the non-ohmic interface, thereby creating localized conductance channels across the active region 16. This shunts the electronic tunneling barrier at the non-ohmic interface and turns the device ON. The opposite electric field pushes the defects back toward the ohmic interface and restores the electronic tunneling barrier at the interface between the active region 16 and the top electrode 14 in FIG. 2A or the bottom electrode 12 in FIG. 3A. It is to be understood that the rectification orientation of the device 10, 10', 10" in its initial state determines the switching polarity of the device 10, 10', 10". As such, in these instances, the polarity of the device 10, 10', 10" may be altered by controlling the temperature during the ALD process, thereby controlling the defect profile in the active region 16 and altering the rectification orientation of the device 10, 10', 10" in its initial state.

Figure 3B:
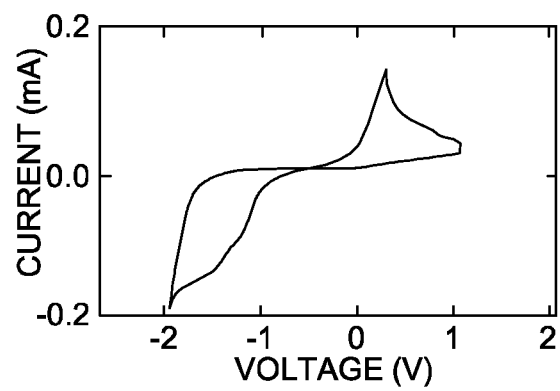
FIG. 3B is a graph illustrating a current vs. voltage (IV) curve for the embodiment of the memristive device of FIG. 3A.

The corresponding current vs. voltage graphs of the devices 10', 10" shown in FIGS. 2A and 3A are respectively shown in FIGS. 2B and 3B. As illustrated in FIG. 2B, a negative voltage on the top electrode 14 causes the positively charged oxygen vacancy defects to drift toward the top electrode 14, thereby narrowing the tunneling gap and turning the device 10' ON. As expected based on the defect profile shown in FIG. 3A, the device 10" illustrates the opposite. In the embodiment of the device 10" of FIG. 3A, a positive voltage on the top electrode 14 causes the positively charged oxygen vacancy defects to drift toward the bottom electrode 12, thereby narrowing the tunneling gap and turning the device 10' ON (as shown in FIG. 3B).

As such, the method disclosed herein enables the engineering of the defect profile such that the memristive device 10, 10', 10" is operable with a predetermined switching polarity.

The embodiments shown in FIGS. 2A through 3B illustrate active regions including $TiO_2$ and $TiO_{2-x}$. As previously mentioned, other metal precursors may be used, and nitrogen or sulfur precursors may be used to form the defects. As such, other examples of suitable active region 16 materials include $NiO_2$ and $NiO_{2-x}$ (where $0<x<2$), GaN and $GaN_{1-x}$ (where $0<x<1$), $ZrO_2$ and $ZrO_{2-x}$ (where $0<x<2$), $HfO_2$ and $HfO_2$, (where $0<x<2$), or $SrTiO_3$ and $SrTiO_{3-x}$ (where $0<x<3$), or $Cu_2S$ and $CuS_{2-x}$ (where $0<x<1$).

Figure 4:
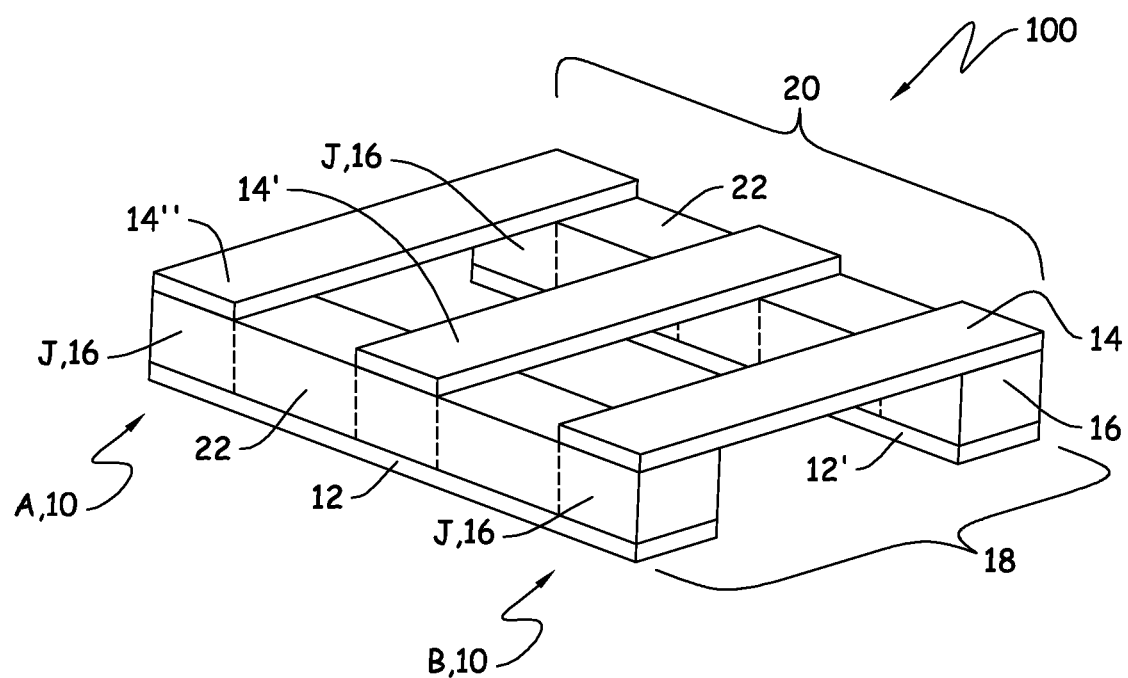
FIG. 4 is a semi-schematic perspective view of an embodiment of a crossbar array including a plurality of memristive devices.

Referring now to FIG. 4, a crossbar array 100 is depicted including a plurality of the memristive devices 10 (two of which are also labeled A and B). It is to be understood that the materials described herein may be used in the memristive devices 10 of the crossbar array 100.

Generally, the crossbar 100 is an array of switches wherein each member in one set 18 of parallel electrodes 12, 12' connects to every member of a second set 20 of parallel electrodes 14, 14', 14" that intersects the first set 18. In many instances, the two sets 18, 20 of electrodes 12, 12', 14, 14', 14" are perpendicular to each other. However, this is not a necessary condition, and the two sets 18, 20 of electrodes 12, 12', 14, 14', 14" may be offset at any non-zero angle.

It is to be understood that each of the junctions J (i.e., crosspoints) in the crossbar 100 includes a respective active region 16 having a controlled defect profile. In one embodiment of such an array 100, the controlled defect profile in one active region 16 is the same as the controlled defect profile in each other active region 16. In this embodiment, the same ALD process may be used to form each active region 16. In another embodiment of such an array 100, the controlled defect profile in one active region is different from the controlled defect profile in at least one other active region 16. In such an embodiment, the materials of the active regions 16 are selectively deposited at different times (and with different varying temperature schemes) on different desirable positions on the electrode 12. Each active region 16 formed in such a manner will have a different defect profile from each of the other active regions 16. As such, different memristive devices 10, 10', 10" may be formed in the same array 100.

Each of the active regions 16 is individually addressable after initial fabrication by virtue of the respective electrodes 12, 12', 14, 14', 14" being in selective electrical contact with the respective active region 16. For example, if electrodes 12 and 14" are addressed with an appropriate voltage and polarity, memristive device A, 10 is activated and switched to either the ON state or the OFF state, and if electrodes 12 and 14 are addressed with an appropriate voltage and polarity, memristive device B, 10 is activated and switched to either the ON state or the OFF state. In the array 100, it is to be understood that when one or more individual devices 10 are addressed, the materials 22 positioned adjacent to the junction J (i.e., not in the junction J) remain inactive, as no voltage is applied therebetween.

In any of the embodiments disclosed herein, the device 10, 10', 10" and/or crossbar 100 may be established on a substrate (not shown). The substrate may be any desirable material, including, but not limited to insulating materials or semiconductor materials. Non-limiting examples of specific substrate materials include silicon dioxide, silicon nitride, magnesium oxide, aluminum oxide, sapphire, strontium titanate, glass, or the like. The substrate may also include an insulating layer of one of the listed materials on a conducting or semiconducting substrate.

As previously described, the device 10, 10', 10" may be switched between the ON and OFF states by applying appropriate voltages across the junction(s) J in order to drive the defects vertically through the active region 16. The voltage applied will depend, at least in part, on the material system used for the device 10, 10', 10". Non-limiting examples of such voltages range from about 1 V to about 2 V (volts). Furthermore, the electric field between the electrodes 12, 14 in the device 10, 10', 10" during operation should generally be larger than about 100 kV/cm (kilovolts/centimeter).

The ALD process disclosed herein results in very clean (e.g., little or no pin holes) amorphous or crystalline layers. It is believed that the phase of the final product does not depend upon the initial precursors used. It is further believed that grain boundaries are either not present or are not deleteriously affecting the performance of the resulting layers.

To further illustrate embodiment(s) of the present disclosure, an example is given herein. It is to be understood that this example is provided for illustrative purposes and is not to be construed as limiting the scope of the disclosed embodiment(s).

Example

Many memristive devices were formed using atomic layer deposition. Tetrakis(diethylamido)titanium(IV) was used as the metal precursor and water was used as the oxygen precursor. Platinum electrodes were used in each of the devices. The growth temperature and pulse duration were fixed for the growth of each $TiO_2/TiO_{2-x}$ film. A different pulse duration was used to deposit the precursors for each film. One pulse was 0.7 s, the second pulse was 0.07 s, and the third pulse was 0.007 s. A different growth temperature was also used for each film. The growth temperature ranged from 100° C. to 250° C.

While the growth temperature and pulse duration were fixed during growth of the films in this example, it is to be understood that if a continuous gradient of defects (e.g., oxygen vacancies) were desirable, the temperature may be continuously changed during film/layer growth; and if multiple areas having different defect concentrations were desirable, the temperature may be changed one or more times during film/layer growth.

Figure 5:
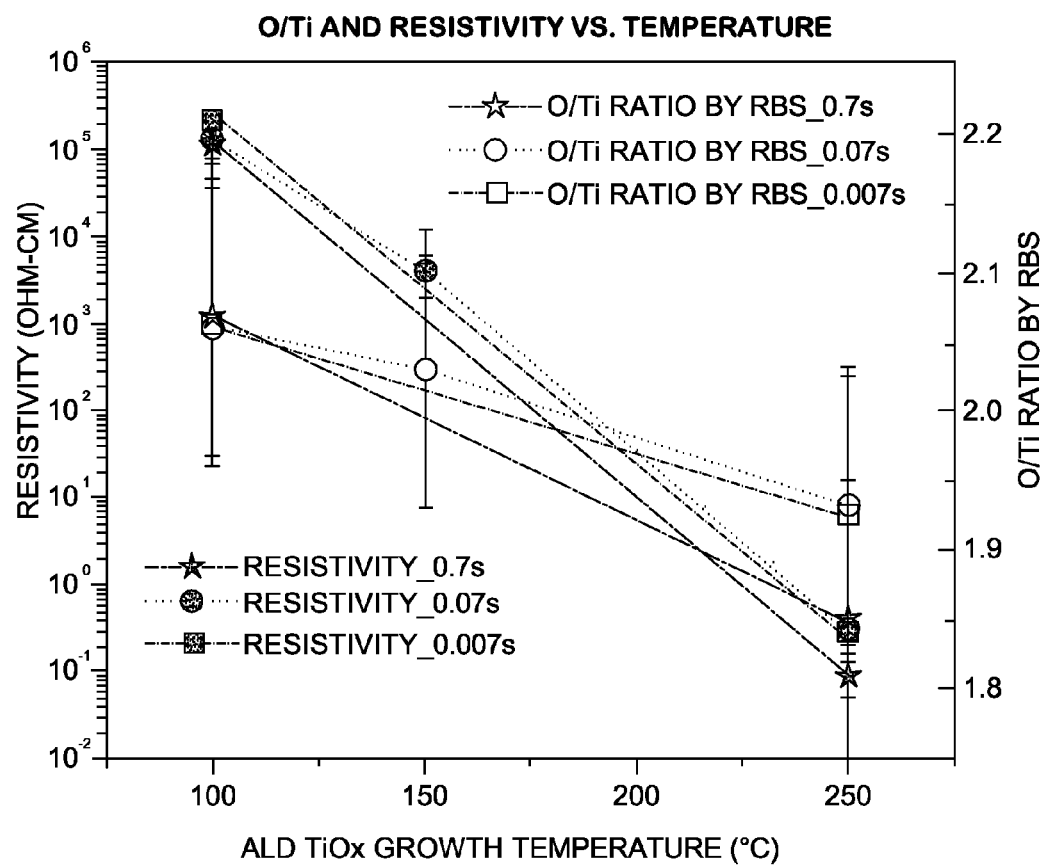
FIG. 5 is a graph depicting both oxygen/titanium ratio vs. temperature and resistivity vs. temperature for various pulse durations during an atomic layer deposition process of $TiO_x$.

The O/Ti ratio (as measured by RBS (Rutherford backscattering spectroscopy)) of each $TiO_2/TiO_{2-x}$ films grown at three different temperatures (i.e., 100° C., 150° C., and 250° C.) by the ALD process is shown in FIG. 5. As depicted, the 0/Ti ratio of each film decreased as the ALD growth temperature was increased, and thus the concentration of oxygen vacancies increased as the temperature was increased. By varying the temperature in a desirable manner throughout the formation of the film, the concentration of the oxygen vacancies may be controlled.

The results also indicate that the effect of pulse duration on oxygen vacancy concentration is negligible. This may be due, at least in part, to the fact that the ALD process is limited by the chemistry at the deposition surface for each growth cycle.

The resistivity of the layers formed using the respective pulse durations and temperatures is also shown in FIG. 5. As depicted, the resistivity of the layers having no defects therein (i.e., the layers formed at 100° C.) was much higher than the resistivity of the layers having defects formed therein (i.e., the layers formed at 250° C.).

Figure 6:
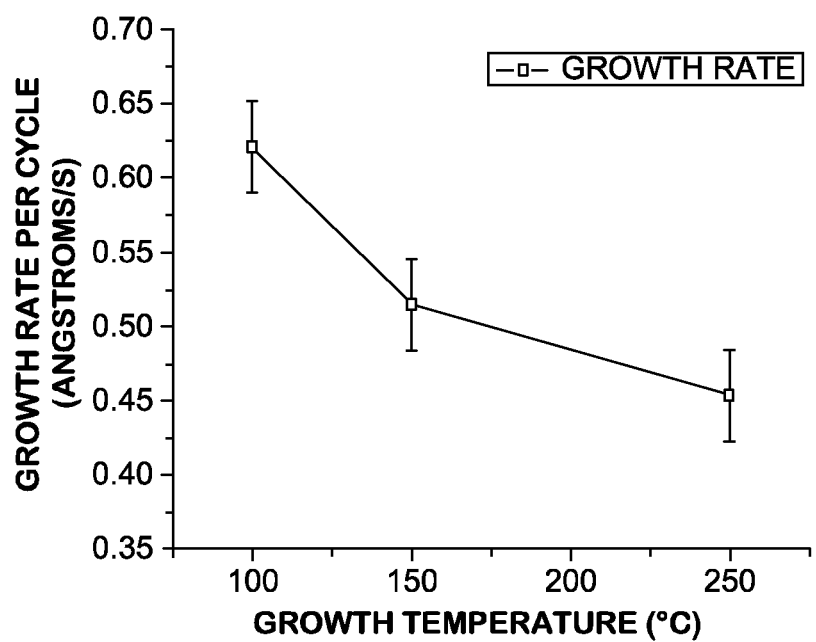
FIG. 6 is a graph depicting the growth rate per cycle vs. the growth temperature during an atomic layer deposition process of $TiO_x$.

FIG. 6 illustrates the growth rate per cycle as the growth temperature was increased for each of the ALD processes. These results depict the results at the 0.7s pulse duration. As depicted, the growth rate decreased as the temperature increased. This result is contradictory to many other ALD processes, and may be different due to the material system used herein.

As shown in this Example, both the oxygen vacancy defect profile and the electrical properties of the device 10, 10', 10" may advantageously be controlled using the controlled ALD process described herein. It is believed that such a process may advantageously be used to control the defects in other material systems, such as those discussed hereinabove.

While several embodiments have been described in detail, it will be apparent to those skilled in the art that the disclosed embodiments may be modified. Therefore, the foregoing description is to be considered exemplary rather than limiting.

What is claimed is:

1. A memristive device, comprising:
   a first electrode;
   a second electrode crossing the first electrode at a non-zero angle;
   an active region disposed between the first and second electrodes; and
   a continuous gradient of a single type of defect formed in the active region, the continuous gradient including an increasing or decreasing concentration of the single type of defect along a thickness of the entire active region.

2. The memristive device as defined in claim 1 wherein the active region is selected from the group consisting of an oxide, a nitride, and a sulfide, and wherein the single type of defect is respectively selected from the group consisting of oxygen vacancies, nitrogen vacancies, and sulfur vacancies.

3. The memristive device as defined in claim 1 wherein the active region thickness ranges from about 2 nm to about 100 nm.

4. The memristive device as defined in claim 1 wherein when the memristive device is in an OFF state, a portion of the active region is substantially void of the single type of defect.

5. The memristive device as defined in claim 4 wherein i) the portion is adjacent to the first electrode, or ii) the portion is adjacent to the second electrode.

6. A method for making a memristive device, the method comprising:
   forming an active region including multiple metal oxide layers, multiple metal nitride layers, or multiple metal sulfide layers, wherein a cycle to form one of the multiple metal oxide layers, one of the multiple metal nitride layers, or one of the multiple metal sulfide layers includes:
   exposing a surface of an electrode to a pulse of a metal precursor;
   exposing the surface to one of an oxygen precursor, a nitride precursor, or a sulfide precursor; and
   controlling a temperature at which the exposing steps take place, thereby controlling a concentration of a single type of defect throughout a thickness of the one metal oxide layer, the one metal nitride layer, or the one metal sulfide layer; and
   varying the temperature continuously at each cycle to form a continuous gradient of the single type of defect in the active region, the continuous gradient including an increasing or decreasing concentration of the single type of defect along a thickness of the entire active region.

7. The method as defined in claim 6 wherein the surface is exposed to an oxygen precursor selected from the group consisting of water, oxygen plasma, and ozone, or a nitrogen precursor selected from the group consisting of $NH_3$ and $N_2/H_2$, or a sulfide precursor of $H_2S/N_2$.

8. The method as defined in claim 6, further comprising engineering the continuous gradient such that the memristive device is operable with a predetermined switching polarity.

9. The method as defined in claim 6, further comprising engineering the continuous gradient such that the active region exhibits a predetermined resistivity.

10. The method as defined in claim 6 wherein the exposing steps are accomplished via atomic layer deposition.

11. A method for making a memristive device, the method comprising:
    exposing a surface of an electrode to a pulse of a metal precursor;
    exposing the surface to one of an oxygen precursor, a nitride precursor, or a sulfide precursor, thereby forming one of a metal oxide layer, a metal nitride layer, or a metal sulfide layer having a predetermined amount of defects therein; and
    controlling a temperature at which the exposing steps take place, thereby controlling a concentration of the defects throughout a thickness of the one of the metal oxide layer, the metal nitride layer, or the metal sulfide layer;
    wherein the metal precursor is a titanium precursor having a chemical formula of $C_{16}H_{40}N_4Ti$.

12. A crossbar array, comprising:
    a first set of at least two parallel electrodes;
    a second set of at least two parallel electrodes crossing the first set of at least two parallel electrodes at a non-zero angle;
    a junction formed at each point where one of the at least two parallel electrodes in the first set crosses one of the at least two parallel electrodes in the second set;
    an active region disposed in each junction; and
    a continuous gradient of a single type of defect formed in each of the active regions, the continuous gradient including an increasing or decreasing concentration of the single type of defect along a thickness of the entire active region.

13. The crossbar array as defined in claim 12 wherein the continuous gradient in the active region formed in one of the junctions is different from the continuous gradient in the active region formed in another of the junctions.

14. The crossbar array as defined in claim 12 wherein the continuous gradient in each of the active regions is the same.

15. The crossbar array as defined in claim 12 wherein each active region is selected from the group consisting of an oxide, a nitride, and a sulfide, and wherein the single type of defect is respectively selected from the group consisting of oxygen vacancies, nitrogen vacancies, and sulfur vacancies.

* * * * *